United States Patent [19]

Jansen et al.

[11] Patent Number: 5,446,621

[45] Date of Patent: Aug. 29, 1995

[54] PLATFORM MODULE SYSTEM FOR A LARGER ELECTRONIC SYSTEM

[75] Inventors: Peter H. Jansen, Durham; Viral K. H. Chokshi, Cary, both of N.C.

[73] Assignee: Wandel & Goltermann ATE Systems Ltd., Morrisville, N.C.

[21] Appl. No.: 234,853

[22] Filed: Apr. 28, 1994

[51] Int. Cl.$^6$ .............................................. H05K 7/00
[52] U.S. Cl. ................................. 361/729; 361/734; 361/736; 439/108; 439/109; 174/252
[58] Field of Search ............... 361/729, 734, 736, 735, 361/738, 748, 730, 785, 789, 791; 174/52.2, 252; 439/45, 46, 53, 60, 108, 109

[56] References Cited

U.S. PATENT DOCUMENTS

| | | | |
|---|---|---|---|
| 3,662,225 | 5/1972 | Carter et al. | 317/118 |
| 4,840,570 | 6/1989 | Mann, Jr. et al. | 439/74 |
| 4,893,301 | 1/1990 | Andrews et al. | 370/58.2 |
| 4,996,630 | 2/1991 | Liguori et al. | 361/412 |
| 5,016,086 | 5/1991 | Inoue et al. | 357/74 |
| 5,032,951 | 7/1991 | Schropp et al. | 361/391 |
| 5,075,821 | 12/1991 | McDonnal | 361/386 |

*Primary Examiner*—Leo P. Picard
*Assistant Examiner*—Young Whang
*Attorney, Agent, or Firm*—Moore & Van Allen; William G. Dosse

[57] ABSTRACT

On a printed circuit board or module card (20) of a standard size for a particular type of system, one or more different, smaller circuit cards or sub-modules (50) can be selectively mounted on the module card so as to utilize a maximum of its area. The module card has openings or holes (30) therein so as to provide component clearance and thus prevent the thickness of the module card from reducing the maximum permissible height of the components that can be mounted on the sub-modules. In order to minimize the amount of module card area devoted to interconnecting to the sub-modules, the sub-modules plug into the module card as the sub-module is moved in a direction perpendicular to the plane of the module card rather than in a direction parallel to the plane of the module card. Circuit wiring and switching (FIG. 5) is provided on the module card to interconnect selected system conductors to the same connector on each of the sub-modules or to a different connector on each sub-module, thereby affording flexibility of design and placement of sub-modules on the module card.

20 Claims, 4 Drawing Sheets

PLATFORM MODULE SYSTEM FOR A LARGER ELECTRONIC SYSTEM

TECHNICAL FIELD

The present invention relates to modular electronic circuit systems and particularly to an improved module for minimizing the wasted or unused space on modules that make up the system.

BACKGROUND ART OF THE INVENTION

In many electronic circuit systems, the system is made up of many modules. Each module is a printed circuit card that carries many circuit components, including integrated circuits. Each module is a printed circuit card of a standard size large enough to yield efficient, economical manufacture. Each printed circuit card or module is mounted in one of a plurality of slots in a metal frame or rack.

The frame or rack is typically constructed with a fixed, finite spacing between printed circuit card slots, with a spacing determined by the height of the electronic components that are expected to be mounted on the overwhelming majority of the circuit cards or modules. Complex electronic systems can be very large and thus occupy a lot of space. Therefore, generous spacing between card or module slots on a frame or rack is to be avoided.

Each printed circuit card or module has some form of connection facility or connector on at least one of its four edges. This connection facility is plugged into a mating connection facility or connector on a printed wiring backplane or motherboard of the system. The backplane carries power busses to all of the printed circuit board connectors, as well as signalling, data, and timing busses. All of this serves to meld the several printed circuit cards or modules into a formation that constitutes the desired system.

Each printed circuit card or module is specifically manufactured to perform one or more very specific functions within the system. In order to maximize the use of printed circuit card "real estate," the circuitry to perform two or more separate functions can and often is mounted on the same printed circuit card or module. However, when a module is designed and manufactured to contain the circuitry for more than one function, there may be systems in which one but not all of the functional circuits on the module are needed. This can be wasteful.

Also, if a fault is isolated to one of the circuit functions of a multi-function card or module, the entire module card is usually replaced and discarded or sent for factory repair, not just the faulty function circuit. Therefore, the attempt to achieve manufacturing economies can actually defeat maintenance and repair economies.

Attempts have been made to mount more than one smaller, functional printed circuit cards (sub-modules) on a single standard-size module card. Added connectors and clips to hold the sub-module cards to the module card usually occupy an inordinate amount of that valuable "real estate" on the module card. Still more "real estate" is lost in order to accommodate the space needed to slide the sub-modules into their connectors.

Also, since both the original module card and the sub-module card are now sandwiched together in one slot spacing in the frame or rack, there is either a reduction in the height permitted for the circuit components that can be mounted on the sub-module, or an adjacent slot in the frame must be left vacant in order to accommodate the now thicker sandwich module card. Neither of these alternatives is desirable.

In many electronic systems, connection must be made both to the edge of the module card that connects to the backplane board and to the opposite edge of the module card. Such opposite-edge connection needs are common in the field of electronic testing systems. In the testing field, it is often desired to connect various test instruments or units under test to the opposite edge of the module card. When placing more than one circuit function on a module card, it is necessary that provision be made to provide access from the opposite edge of the module card to each of the different functional circuits on the module card.

When a module card is built to accommodate sub-module cards, provision must be made for interconnection of the sub-module cards to both edges of the module card. This is even more important when the module card is intended to be of a general-purpose nature, with the ability to accept a number of different types and sizes of sub-module card at any one of several positions on the module card.

When a general-purpose module card is constructed, it is not always possible to plan exactly where each and every backplane conductor will connect to a sub-module. Therefore, it is sometimes difficult to plan conductor routings from the backplane, through the general-purpose module, and to the sub-module.

DISCLOSURE AND SUMMARY OF THE INVENTION

It is an object of the present invention to provide a novel electronic circuit card module for an electronic circuit system which maximizes the flexibly of support of a plurality of individually-removable electronic circuit sub-module cards without restricting the height of components that can be used in the system, while minimizing the amount of space needed to flexibly mount the sub-module cards, by means of an opening in the module card, which opening is approximately aligned within the area of the sub-module.

It is another object of the present invention to provide a novel electronic circuit card module for an electronic circuit system which minimizes the amount of space on the module that is required to achieve physical layout flexibility by providing a sub-module which electrically engages the module by moving in a direction perpendicular to the module, thereby avoiding the need for additional area of the module to allow connector relative motions so as to achieve electrical couplings between the module and the sub-module.

It is still another object of the present invention to provide a novel electronic circuit card module for an electronic circuit system which facilitates flexible connection between the module and a circuit sub-module card for achieving highly selective electrical interconnection between the external connections to the circuit card module and the connections between the circuit card module and the sub-module card.

It is yet another object of the present invention to provide a novel electronic circuit card module having a plurality of connectors to external circuitry, for an electronic circuit system which facilitates flexible design and construction, by including a sub-module circuit card and flexible means for interconnecting the sub-module circuits with selected of the connectors to external circuitry.

BRIEF DESCRIPTION OF DRAWINGS

For a more complete understanding of the nature and objects of the present invention, reference should be made to the following Detailed Description taken in connection with the accompanying Drawings in which.

DETAILED DESCRIPTION OF THE BEST MODE FOR CARRYING OUT THE INVENTION AND ITS INDUSTRIAL APPLICABILITY

Figure 1:
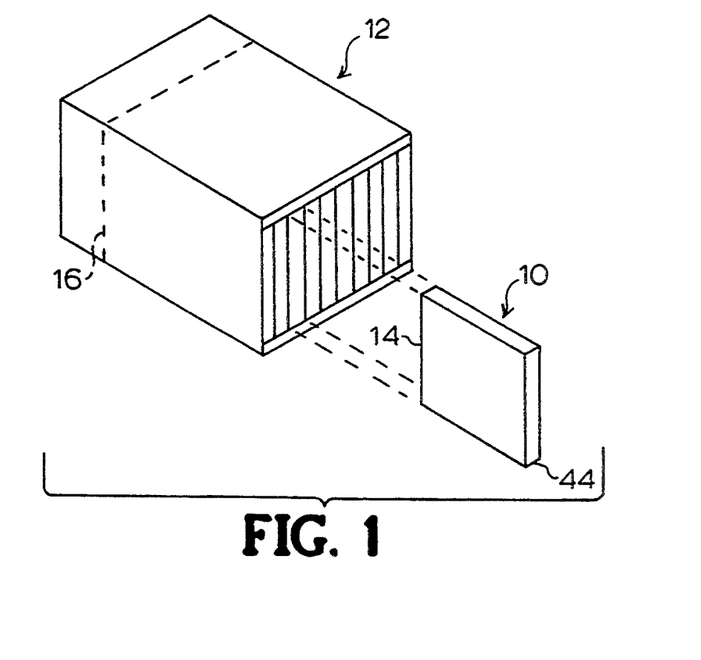
FIG. 1 is a schematic in perspective of a frame or rack for holding electronic printed circuit modules.

Referring now to the accompanying drawings and more particularly to FIG. 1, a "standard" printed circuit module 10 is one of many that can be mounted in separate slots (not shown) of a circuit frame 12, to constitute a large electronic circuit system. The term "standard" when applied to a printed circuit module means that all of the modules that are mounted in the slots of the frame 12 are of the same overall physical dimensions and have the same wiring connections at their edge 14 that enters the frame 12 first. Each standard module includes an area that is normally occupied by functional circuit components.

All of the standard modules in the frame 12 are connectorized at their edges 14 to engage mating connectors (not shown) on a backplane printed circuit board 16 at the rear of the frame 12 and shown by dotted lines in FIG. 1. The backplane board 16 carries all of the bus conductor structure of the large electronic circuit system.

Any one of many kinds of "standard" module sizes and shapes can be selected, along with any suitable frame and backplane card arrangement to match the "standard" module desired. However, the backplane 16 preferably carries conductors and connectors according to one of several card-size specifications and bus arrangements known by the umbrella designation "VXI." The arrangements and characteristics of the VXI bus are described in a public-domain publication entitled *VXI System Specification*. Revision 1.3 of that Specification is dated Jul. 14, 1989. The Specification was authored by the VXIbus Consortium, Inc. and its sponsoring members. Copies of the Specification can be obtained from sponsoring members, which include a large number of nationally-known electronics and instrument manufacturers, such, for example, as Hewlett-Packard Co., National Instruments Corp., and Tektronix, Inc.

Figure 2:
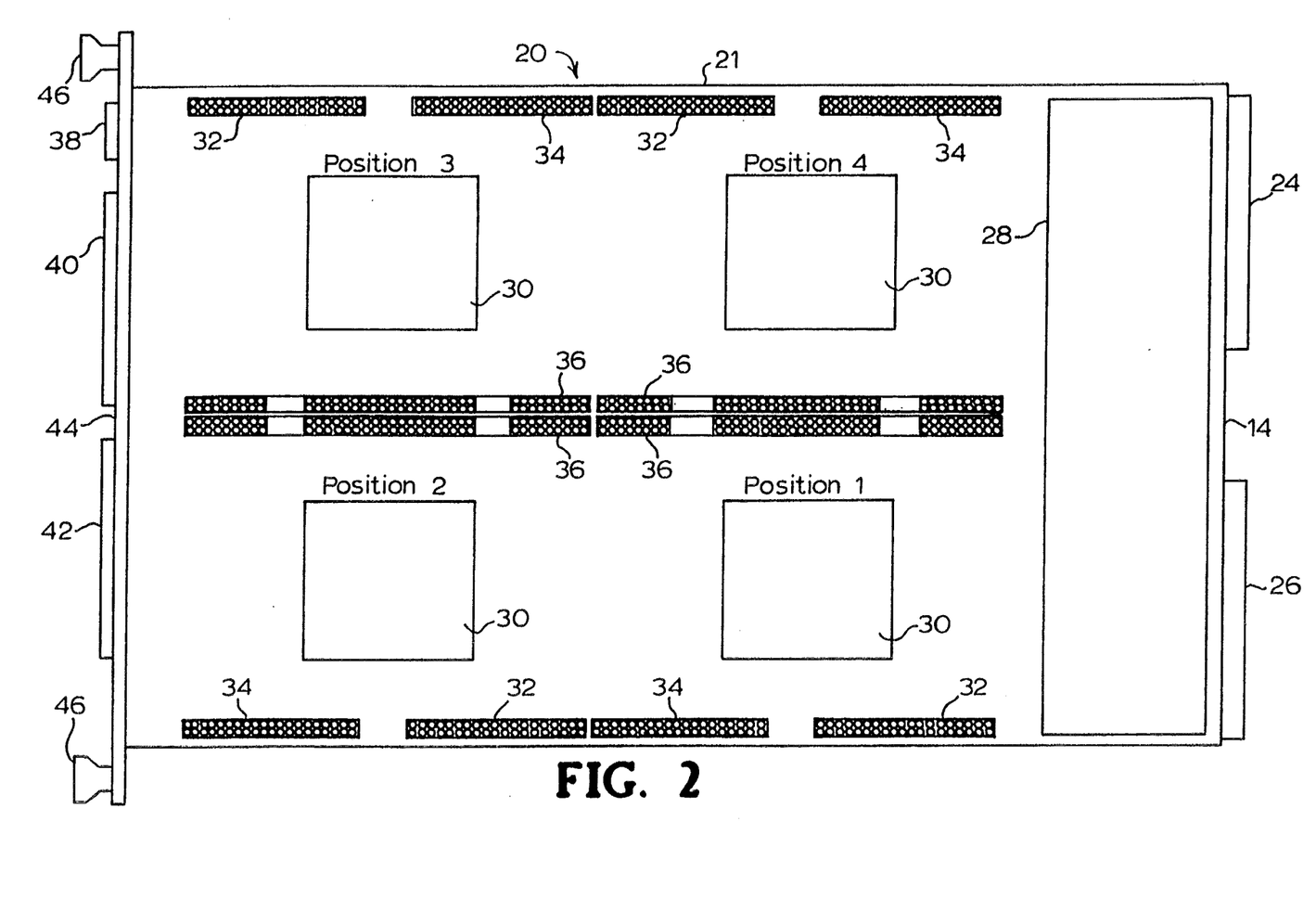
FIG. 2 is a schematic of an empty module card showing where up to four sub-modules could be mounted thereon.

Referring now to FIG. 2, a module card 20 is shown. The module card 20 is not like the rest of the standard cards 10; although, it has the same shape, physical dimensions, and electrical connector wiring to make it compatible with the VXI bus at the backplane 16. The module card 20 is based upon a printed wiring board 21, the structure or composition of which will be described in connection with FIG. 4. Like any standard module 10, the module card 20 has, at its inner edge 14, two connectors 24 and 26, which are compatible with and mate with the VXI bus of the backplane 16. The inner edge 14 of the module card 20 is the edge which enters the frame 12 (FIG. 1) first.

A VXI interface 28 is located on the module card 20 adjacent the edge 14. The VXI interface 28 includes common [conventional]power, timing, input/output, buffering and other circuitry routinely needed to allow the circuitry on any standard module 10 of a specific manufacturer to function in connection with the rigors of the VXI bus requirements.

Up to four sub-module positions are provided on the module card 20 shown in FIG. 2. However, the number of sub-module positions is entirely arbitrary and can be from one up to any economically practicable number. The area of the module card 20 that can be occupied by sub-modules is also entirely arbitrary, within the limits of size of the module card 20 and the area of a sub-module. the area of the module card 20, that corresponds with the area of a standard module that would normally be occupied by functional circuits can be fully occupied by sub-modules or can be occupied by a combination of functional circuits and one or more sub-modules. In many instances it may actually be more economically advantageous to reserve some of the functional area of a module card for directly mounting electronic components and to reserve the rest of the functional area of the module card for mounting sub-modules.

There is an opening or hole 30 in the module board 21 at each sub-module position. The purpose of the hole 30 is to accommodate components mounted on a sub-module, which components can be as high as the maximum allowable height permitted with a conventional VXI module by the slot-spacing standards of the VXI bus Specification. By providing a hole 30 at each sub-module position, components of the same maximum height can be mounted on sub-modules as can be mounted on a standard module 10.

Without the hole 30, the maximum height of the components mounted on a sub-module would be equal to the maximum height permitted on a standard module 10 less at least the thickness of the module board 21. Also, if components are mounted on both sides of the sub-module (which is actually preferred), some of them can be accommodated in the hole 30, so as to allow taller components to be used on one side or even on both sides of the sub-module.

Any hole 30 necessarily tends to weaken the structural integrity of the module card 20. Therefore, each hole 30 should not be any larger than necessary to accommodate all of the tallest components reasonably expected to be mounted on any sub-module that is in turn to be mounted on the module card 20. This is an arbitrary balancing act between the area of the hole 30 and the freedom of design in the placement of tall components on a sub-module. However, it will realistically be expected that the area of the hole 30 should be a substantial proportion of the area of a sub-module, in order to allow freedom in the design layout of the sub-modules.

Each sub-module position on the module card 20 arbitrarily has three multi-contact connectors 32, 34, and 36. These three connectors are preferably groups of connector pins inserted in holes through the circuit board of the module card 20 and making electrical connection to the copper foil conductors thereon. There can actually be any reasonable number of rows of connector pins arranged parallel with each other, with gaps as and if desired in the rows. The three connectors are arbitrarily arranged on the module board 21 in such a way as to accommodate mating connectors on a sub-module, in an orientation in which the connectors engage as a sub-module is moved toward the module card 20, in a direction perpendicular to the plane of the module card 20.

The arrangement of the connectors 32, 34, and 36 to engage a sub-module as it moves perpendicular to the plane of the module card 20 promotes minimization of the area of the hole 30 since a larger hole 30 would be required in order to accommodate tall components if the sub-module had to slide into a connector in a direction parallel with the plane of the module card 20. Also, if the sub-module had to slide into a connector in a direction parallel with the plane of the module card 20, there would have to be unused space on the module card 20 that must be made available to the sub-module prior to sliding into place and which would then be vacated by the sub-module as it slides into place.

The arrangement of the connectors 32, 34, and 36 also concentrates the connectorization of the sub-modules along two of their edges. This minimizes the area of the sub-modules that is used for connectorization and maximizes the area used for functional circuitry. By so arranging the connectorization on the surface of the module card 20, nearly the entire area of the module card (that corresponds with the functional circuit area of a standard card) can be devoted to sub-modules and their functional circuitry. The maximization of the functional utilization of circuit-card "real estate" is important in the design of electronic systems.

Referring again the FIG. 2, three connectors 38, 40, and 42 are preferably located on an outer edge 44 of the module card 20, opposite to the inner edge 14. These three connectors are arbitrarily referred to, respectively, as the utility, primary, and secondary ports. Since the three connectors 38, 40, and 42 are located at the outer edge 44 of the module card 20, they are accessible even when the module card 20 is mounted in the frame 12 (see FIG. 1). These accessible connectors are useful in a testing environment since they can be connected to instrumentation that is external to the frame and can be connected to units under test. Two extraction levers 46 are also conventionally provided on the edge 44 to aid in extracting the module card 20 and its connectors 24 and 26 from the mating connectors (not shown) on the backplane 16.

While four identical sub-module positions are shown in FIG. 2, the sub-modules need not be identical but can cover two positions, in either direction, or can be L-shaped and can cover three positions. Also, a module card 20 can be made without a hole at one or more positions, and part of the module card 20 can carry functional circuit components, directly.

The module card 20, just like the standard modules 10, carries printed-wiring conductors. However, on the module card 20, the printed-wiring conductors interconnect the various sub-module positions with each other, with the VXI interface 28 and any other components on the module card 20, and with the several connectors on the edges 14 and 44. The general arrangement of the printed-wiring conductors on the module card 20 is described in connection with FIG. 5.

Figure 3:
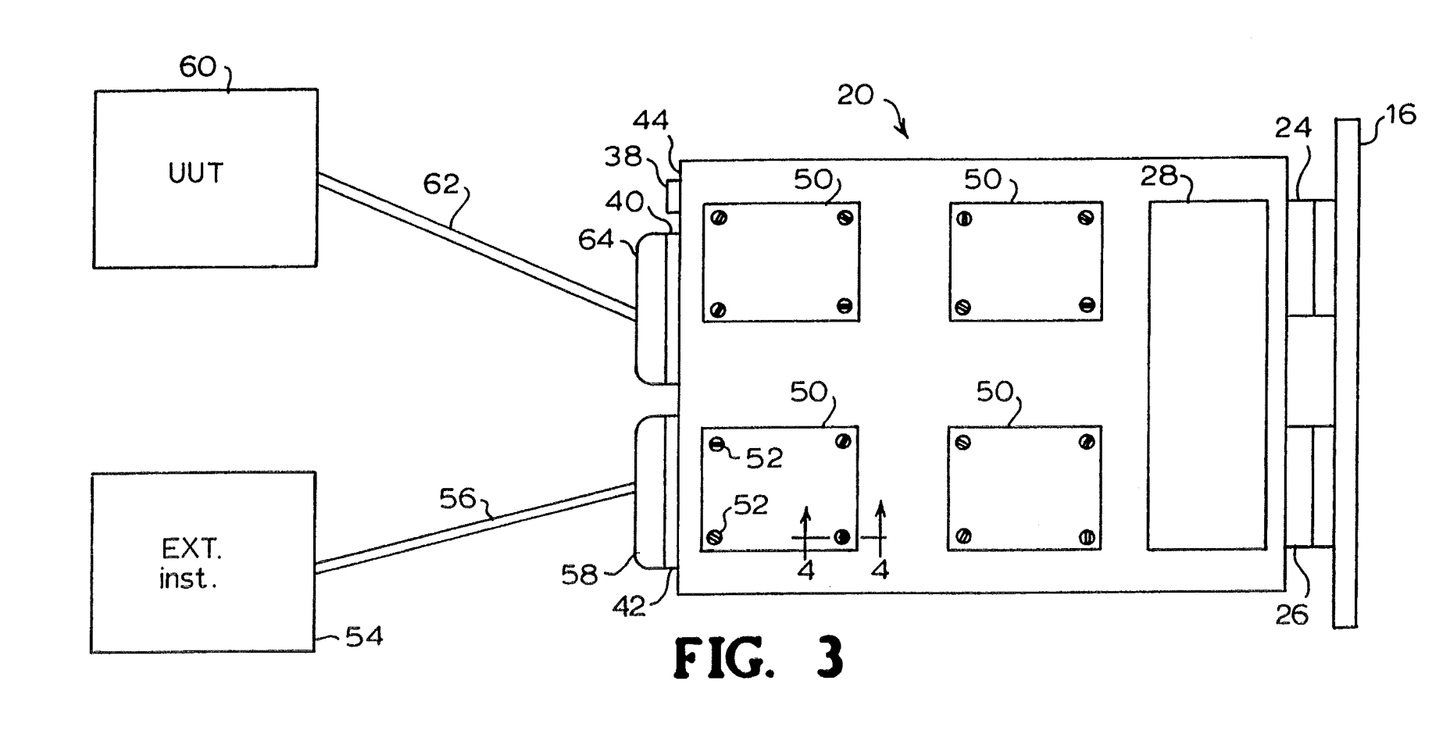
FIG. 3 is a schematic of a populated module card showing attachment to an external instrument and a unit under test.

Referring now to FIG. 3, the module card 20 is shown with four sub-modules 50 in place, mounted on the module card 20. The module card 20 is illustrated with its connectors 24 and 26 plugged into two mating connectors on the backplane 16. Each of the sub-modules 50 is held in place on the module card 20 by four machine screws 52, one at each corner of the sub-module 50. The preferred relationship of the pins of the connectors 32, 34, and 6 to the machine screws 52 is illustrated and described more fully in connection with FIG. 4.

As an example of how the connectors 38, 40, and 42 along the edge 44 can be used in a testing system, an external instrument, such, for example, as an analog generator and receiver 54, can be used with the module card 20 populated with sub-modules 50. The analog generator/receiver 54 can be connected by a cable 56 and a plug 58 to the connector 42.

A unit under test (UUT) 60 is connected by a cable 62 and a plug 64 to the connector 40. The UUT 60 might be a production printed circuit card, of the type used in great numbers in a telephone central office switching exchange. Such a test of a UUT would usually take place after the UUT had been manufactured in the telephone equipment manufacturer's factory. The four sub-modules 50 might contain all of the logic for testing the UUT 60, when working with the analog generator/receiver 54. One purpose of using the module card 20 and the sub-modules 50 is that several different but similar UUTs can be tested using, for example, two or three common sub-modules 50. Then, there need be only one or two sub-modules that are peculiar to each different version of the many similar UUTs 60. In this way, there is no need to design and manufacture an entire standard module 10 for each different type of UUT to be tested.

A single sub-module 50 might include all of the circuitry necessary to conduct a full test of a UUT 60, or a single sub-module 50 might contain only a part of the circuitry necessary to test a UUT 60. A sub-module 50 might contain sufficient circuitry, when connected to an external test instrument 54, so that together the sub-module and the external test instrument can fully conduct the desired test of the UUT.

As an alternative, it may be possible to connect two different external instruments 54 by two separate cables 56 to the same plug 58. Also, two different UUTs 60 can be connected by two separate cables 62 to a single plug 64. It is thus possible to test two different UUTs, either simultaneously or separately, using the same module card 20 in a single slot on the frame 12. By saving a slot in the frame 12, it may be possible to avoid the purchase of another frame 12 if the frame 12 is fully populated with modules. One advantage here is to have in one module card the capability of testing two different kinds of UUT either simultaneously or alternatively, depending upon the details of the design of the circuit implemented by the sub-modules 50. It is also possible to use the same production sub-modules connected differently in a module card to test a different one or pair of UUTs.

One example of how the connector 38 might be used is for external synchronization or triggering, in or out. This could be to synchronize signals from an external test instrument with internal test circuitry on a sub-module.

Figure 4:
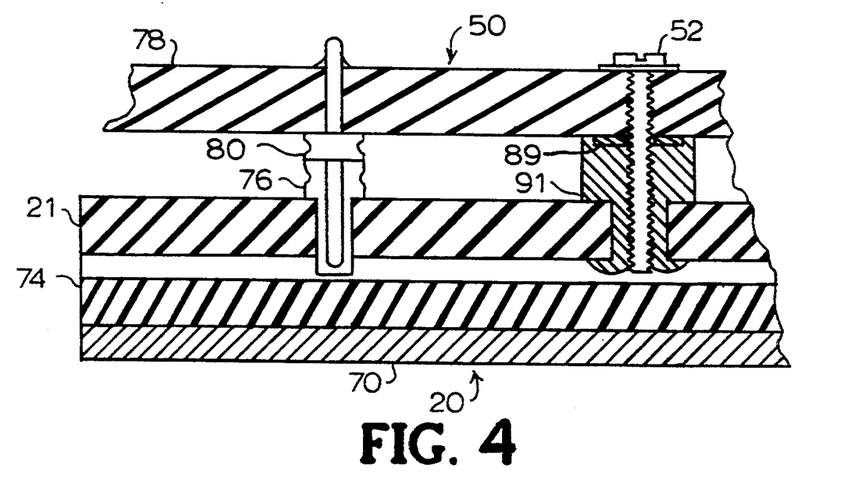
FIG. 4 is a partial cross section, taken along line 4—4 in FIG. 3, showing a detail of the connectorization and mounting of a sub-module to the module card.

Referring now to FIG. 4, a partial cross-sectional view shows an exemplary representation of one of the pins of a connector between the module card 20 and a sub-module 50, along with one of the screw fasteners 52 that hold the sub-module 50 to the module card 20. The conventional printed wiring module board 21 (as described in connection with FIG. 2) is shown with its normally non-component side (the side with the copper foil conductors, in the case of a single-layer printed wiring board) located on the bottom of the module wiring board 21.

A protective metal lid 70 covers the bottom of the module wiring board 21 and protects it from damage or contact with other modules. An insulating layer 74 is bonded to the lid 70 and insulates any copper foil or other conductors on the bottom of the module wiring board 21 from contact with the protective metal lid 70. The upper surface of the insulating layer 74 is preferably spaced from the printed wiring board 21 by a small amount (approximately one millimeter) to allow room for the surface mounting of very thin electronic components on the bottom of the module wiring board 21.

A plurality of pin sockets 76 are positioned in holes in the module wiring board 21 and make electrical connection (for example, by wave soldering) to selected foil conductors on the bottom (or even the top) of the module wiring board 21 or to through-hole connections in the case of a multi-layer module wiring board 21.

The sub-module 50 is based upon a sub-module wiring board 78 preferably having copper foil conductors located on its upper side. Alternatively, like the module wiring board 21, the sub-module board 78 could have multiple layers of conductors with conductive through-holes or have its foil conductors on its lower side. A plurality of connector pins 80 are mounted through the sub-module board 78 and make electrical connection (for example, also by wave soldering) to selected foil conductors on the top of the sub-module board 78.

A pin 80 on the sub-module 50 extends into a mating pin socket 76 on the module wiring board 21. One or more rows of pin sockets 76, in the module card 20 comprise one of the connectors 32, 34, or 36 (FIG. 2). Similarly, one or more rows of the pins 80 comprise one of the connectors on a sub-module that mates with one of the connectors 32, 34, or 36.

Typically, there is a high friction contact between connector pins 80 and their pin sockets 76. This assures good electrical contact and is sometimes even relied upon to hold the connectors together. However, it is important that the sub-module 50 not be inadvertently and easily removed from the module board 21. Also, a high friction connection can be a disadvantage when trying manually to force a sub-module 50 into engagement with the module card 20.

Therefore, in order to draw the pins 80 into the pin sockets 76 and thus connect a sub-module 50 to the module card 20 and also to hold the sub-module in place on the module card 20, an internally-threaded metal spacer or stand-off 91 is riveted into the module board 21 One of the machine screws 52 (see FIG. 3) extends through a hole in the sub-module board 78 and is held in place by a retaining washer 89 that is captured by the threads of the machine screw 52. The top of the stand-off 91 has a recess to accommodate the retaining washer 89.

The machine screw 52 engages the threads in the stand-off 91. As the machine screw 52 is turned in the clockwise direction, it cooperates with the threads in the stand-off 91 to draw the sub-module 50 down to the module card 20 and the pins 80 into the pin sockets 76. Typically, all four of the machine screws 52 at the four corners of the sub-module 50 would be tightened together so as to draw the pins 80 evenly into the pin sockets 76.

The thickness of the stand-off 91 accurately positions the sub-module 50 with respect to the module card 20 so as fully to engage the pins 80 with the sockets 76. When the sub-module 50 is thus drawn no closer than necessary to the module board 21 (assuming the components are on the bottom of the sub-module 50) so as to permit components and the sub-module wiring board fully to occupy the space allowed between slots of the VXIbus backplane 16 and the frame 12 without exceeding the thickness permitted to a standard module 10.

If only low-height components are used on the sub-module 50, two or more sub-module cards can actually be mounted, one on top of the other, piggy-back fashion, on the module card 20. Also, components can be surface mounted on either or both sides of the sub-module, with the hole 30 in the module card 20 permitting the mounting of higher components on the bottom of the sub-module 50.

Figure 5:
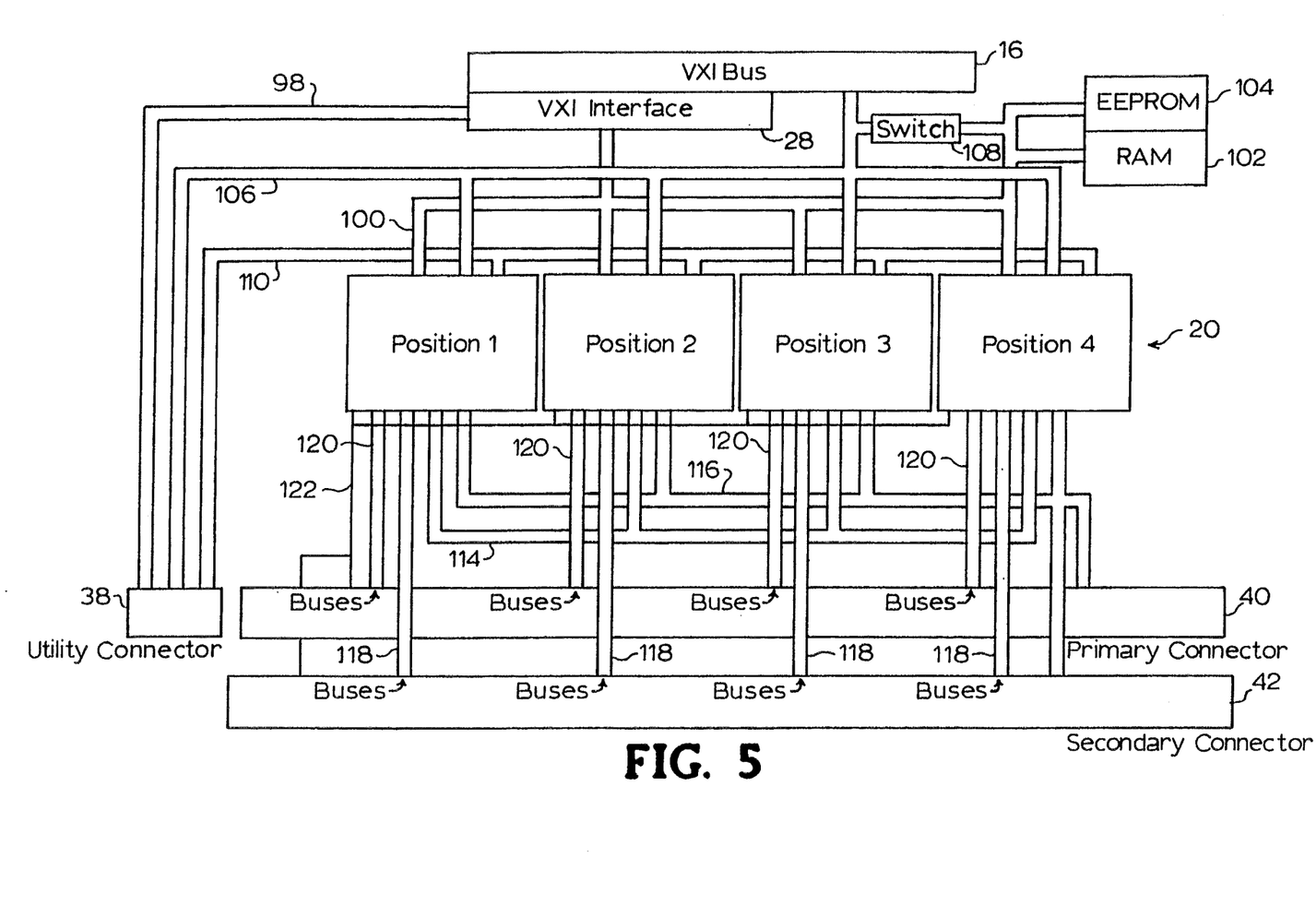
FIG. 5 is a schematic diagram of the circuit wiring on a module card illustrating interconnections between the sub-module positions, the backplane connectors and the opposite edge connectors.

Referring now to FIG. 5, the arrangement of the foil conductors, etc., on the module card 20 is schematically shown. This specific arrangement is entirely arbitrary and exemplary. The VXIbus backplane 16 is connected through the connectors 24 and 26 (see FIG. 2) to the printed wiring module board 21 (see FIG. 4) of the module card 20. A large number of the conductors of the backplane 16 pass through the VXI interface 28. Some, such as for synchronizing and triggering, are conveyed, either directly or through buffering, via a serial control bus 98 to the connector 38. Others pass through buffers, etc., to a control bus 100 that is internal to the module card 20. This control bus 100 connects to all of the sub-module positions and also to a volatile storage or memory (RAM) 102 and an electrically programmable and electrically erasable non-volatile storage or memory (EEPROM) 104.

The two memories 102 and 104 can be loaded (information can be stored in them) by downloading (transmitting) from an external host computer (not shown). The non-volatile memory 104 is better for storing information that does not change often and which is to remain substantially unchanged through many cycles of powering up (turning ON) and powering down (turning OFF) of the electronic circuit system. Status information, such as the mapping or association of selected VXIbus conductors to conductors of the sub-modules, is an important content of the non-volatile memory 104. The volatile memory 102 usually stores programming information and data that is expected to be changed frequently. Some conductors of the VXIbus 16 can preferably be connected on an instrumentation bus 106, directly to the sub-modules 50 without the need to pass through the VXIbus interface 28. The instrumentation bus 16 preferably connects to all of the sub-modules 50 directly, as well as to the connector 38, if desired.

Selected ones of the conductors of the instrumentation bus 106 can be broken out before they are made available to the sub-modules 50. These selected conductors are delivered to an electronically-controlled, static switch matrix 108 which interconnects those selected conductors in an arbitrary arrangement with conductors on the control bus 100 in an arrangement dictated by the digital information contained at selected memory addresses of the non-volatile memory 104. The switch matrix 108 is an integrated circuit device available from National Instruments Corp., one of the sponsors of the VXIbus Consortium, Inc., under the designation of Trigger Interface Chip and part number 701705.

The switch matrix 108 enables software control of which of one or more conductors of a sub-module is ultimately connected to which of several of the conductors of the backplane board 16.

A JTAG bus 110 can be provided to interconnect all of the sub-modules 50 with each other and with the connector 38, to comply with an IEEE Joint Action Group protocol known as the 1141 Standard.

A strictly internal bus 114 interconnects all of the sub-modules 50. Some of the conductors of the internal bus 114 can be low impedance conductors and some can conduct signals between higher impedance inputs and outputs of the sub-modules 50.

A general purpose or GP bus 116 connects all of the sub-modules 50 to the two connectors 40 and 42. Some of the conductors of the GP bus 116 can be for low impedance interconnection and some can be for higher impedance interconnections.

Four sets of conductors 118 are provided, with each set of the conductors 118 connecting terminals in one sub-module 50 with selected ones of the pins of the connector 42. Therefore, each sub-module 50 has a connection to different pins of the connector 42. Similarly, four sets of conductors 120 are provided with each set connecting terminals in one sub-module 50 with selected ones of the pins of the connector 40.

A safety interlock 122 is provided to enable each sub-module 50 to determine whether or not a plug (such as 58 or 64) is plugged into a connector 40 or 42. This safety information is preferably used by the sub-modules to prevent dangerous voltages from being made available for accidental contact by a human operator at exposed pins of an unplugged connector 40 or 42.

The conception and the specific embodiment disclosed above may be readily utilized as a basis for modifying or designing other structures for carrying out the purposes of the present invention. Such equivalent constructions do not depart from the spirit and scope of the invention, as set forth in the appended claims.

What is claimed is:

1. A platform module system for a larger electronic system, said larger electronic system having standard circuit modules spaced apart by a predetermined spacing and capable of accommodating electronic components of an allowable height determined by the predetermined spacing, said standard modules each having an area thereon normally occupied by functional circuit components, comprising:

a platform module having at least one area thereon of a magnitude normally occupied by circuit components on the standard modules of the larger electronic system;

at least one circuit sub-module having an area that is substantially less than the one area of the platform module;

the platform module having capacity for accommodating at least one circuit sub-module on said platform module, with at least one opening in the platform module for accepting high components on the sub-module without reducing the allowable component height within the predetermined spacing, said opening being approximately aligned with the area on the platform module to be occupied by the sub-module, and said opening having an area that is a substantial proportion of the area of the sub-module;

connection means on the platform module for making electrical connections to the sub-module; and connection means on the sub-module for making electrical connections to the platform module.

2. A platform module system according to claim 1 wherein the connection means on both the platform module and the sub-module are arranged so as to allow the sum of the areas of the sub-modules mounted on the platform modules to equal up to substantially the available circuit component area of a standard module.

3. A platform module system according to claim 1 wherein:

the area of a sub-module is substantially less than the area of the one area of the platform module; and the connection means on the sub-module makes electrical connection to the connection means on the platform module as the sub-module is moved in a direction substantially perpendicular to the plane of the platform module.

4. A platform module system according to claim 3 wherein:

the larger electronic system includes a bus with conductors and connectors for interconnecting all of the standard circuit modules;

conductors on the platform module;

conductors on the sub-module;

at least one connector on the platform module for making electrical connection with at least one connector on the bus; and coupling means for making electrical couplings between selected conductors on at least one sub-module and selected conductors of the bus.

5. A platform module system according to claim 4 wherein:

at least one multiconductor connector on the platform module for connection to other than the bus; and coupling means for making electrical couplings between selected conductors on at least one sub-module and selected conductors of the multiconductor connector.

6. A platform module system according to claim 1 wherein:

the larger electronic system includes a bus with conductors and connectors for interconnecting all of the standard circuit modules;

conductors on the platform module;

conductors on the sub-module;

at least one connector on the platform module for making electrical connection with at least one connector on the bus; and coupling means for making electrical couplings between selected conductors on at least one sub-module and selected conductors of the bus.

7. A platform module system according to claim 1 wherein:

the larger electronic system includes a bus with conductors and connectors for interconnecting all of the standard circuit modules;

the platform module includes conductors thereon and at least one connector for making electrical connection with at least one connector on the bus;

conductors on the sub-module;

at least one multiconductor connector on the platform module for connection other than the bus; and coupling means for making electrical couplings between selected conductors on at least one sub-module and selected conductors of the multiconductor connector.

8. A platform module system for a larger electronic system that is made up of standard modules, having an area for accommodating functional circuit components thereon, comprising:

a platform module having a substantially planar surface, electrical conductors thereon, and at least one area thereon of a magnitude normally occupied by functional circuit components on the standard modules of the larger electronic system;

at least one circuit sub-module having conductors thereon and having an area that is substantially less than the area of the platform module;

means on the platform module for accommodating at least one circuit sub-module;

connection means on the platform module for making electrical connections to the sub-module; and connection means on the sub-module for making electrical connections to the connection means on the platform module as the sub-module is moved in a direction substantially perpendicular to the plane of the platform module.

9. A platform module system according to claim 8, wherein:

the connection means on the sub-module comprises a plurality of pins mounted through the sub-module and making electrical connection to electrical conductors on the sub-module; and the connection means on the platform module comprises a plurality of pin-receiving sockets for receiving and frictionally holding the pins of the sub-module, said pin receiving sockets making electrical connection to the electrical conductors on the platform module.

10. A platform module system according to claim 9 further including fasteners for holding the sub-module to the platform module without relying on any frictional grip of the pins and pin receiving sockets to hold the sub-module to the platform module.

11. A platform module system according to claim 10 wherein:

the standard modules are spaced along a bus by a predetermined distance allowing a limited height of electronic components usable with the standard modules; and the platform module has at least one opening therein, located and positioned to accommodate electronic components on a sub-module, mounted on the platform module, which are of up to the same limited height as the electronic components that are usable with the standard modules.

12. A platform module system for a larger electronic system that is made up of standard circuit modules, the larger electronic system including a bus with conductors and connectors for interconnecting all of the standard modules of the larger electronic system, comprising:

a platform module having conductors thereon and having at least one connector for making electrical connection with at least one connector on the bus;

at least one circuit sub-module having conductors thereon; and coupling means for making electrical couplings between selected conductors on at least one sub-module and selected conductors of said bus.

13. A platform module system according to claim 12 wherein:

a plurality of sub-modules are mounted on the platform module; and the coupling means for selectably coupling selected conductors of the bus to selected conductors of the several sub-modules is electrically controllable to change the selectable coupling.

14. A platform module system according to claim 13 wherein the coupling means comprises:

a semiconductor switch connected between the selected conductors of the bus and the selected conductors of the several sub-modules; and storage means for storing the selecting commands for the semiconductor switch for directing the semiconductor switch to couple each of the selected conductors of the one of the several sub-modules to an appropriate one of the conductors on the bus.

15. A platform module system according to claim 12 wherein:

a plurality of sub-modules are mounted on the platform module; and the coupling means couples each of a plurality of the conductors on the bus with the same, corresponding plurality of conductors on each sub-module.

16. A platform module system according to claim 15 further comprising:

electrically-selectable means for controlling the selectable coupling of selected conductors of the bus to selected conductors of the several sub-modules.

17. A platform module system according to claim 12 wherein:

the standard modules are spaced along the bus by a predetermined distance allowing a limited height of electronic components usable with the standard modules; and the platform module has at least one opening therein, located and positioned to accommodate electronic components on a sub-module, mounted on the platform module, which are of up to the same limited height as the electronic components that are usable with the standard modules.

18. A platform module system for a larger electronic system that is made up of standard circuit modules, the larger electronic system including a bus with conductors and connectors for interconnecting all of the standard modules of the larger electronic system, comprising:

a platform module having conductors thereon and having at least one connector for making electrical connection with at least one connector on the bus;

at least one circuit sub-module having conductors thereon;

at least one multiconductor connector on the platform module for connection to other than the bus; and coupling means for making electrical couplings between selected conductors on at least one sub-module and selected conductors of said multiconductor connector.

19. A platform module system according to claim 18 wherein:

a plurality of circuit sub-modules are mounted on the platform module; and other selected conductors of said multiconductor connector are electrically coupled to the same selected conductors of all of the sub-modules mounted on the platform module.

20. A platform module system according to claim 18 wherein:

the standard modules are spaced along the bus by a predetermined distance allowing a limited height of electronic components usable with the standard modules; and the platform module has at least one opening therein, located and positioned to accommodate electronic components on a sub-module, mounted on the platform module, which are of up to the same limited height as the electronic components that are usable with the standard modules.

* * * * *